United States Patent
Kinzer

[11] Patent Number: 5,808,345
[45] Date of Patent: Sep. 15, 1998

[54] HIGH SPEED IGBT

[75] Inventor: Daniel M. Kinzer, El Segundo, Calif.

[73] Assignee: International Rectifier Corporation, El Segundo, Calif.

[21] Appl. No.: 784,418

[22] Filed: Jan. 16, 1997

Related U.S. Application Data

[63] Continuation of Ser. No. 308,655, Sep. 19, 1994, abandoned.

[51] Int. Cl.$^6$ .................................................. H01L 29/76
[52] U.S. Cl. ........................................... 257/378; 257/566
[58] Field of Search ..................................... 257/378, 341, 257/565, 566, 578; 327/207; 326/109, 64

[56] References Cited

U.S. PATENT DOCUMENTS

| | | | |
|---|---|---|---|
| 4,604,535 | 8/1986 | Sasayama et al. | 307/570 |
| 5,198,691 | 3/1993 | Tarng | 257/316 |

FOREIGN PATENT DOCUMENTS

| | | | |
|---|---|---|---|
| 4-170817 | 6/1992 | Japan | 326/109 |

Primary Examiner—Jerome Jackson
Assistant Examiner—Nathan K. Kelley
Attorney, Agent, or Firm—Ostrolenk, Faber, Gerb & Soffen, LLP

[57] ABSTRACT

An auxiliary MOSFET is integrated into a lateral IGBT structure with the source and drain of the auxiliary MOSFET in parallel with the emitter-base circuit of the IGBT. A driver, integrated with the IGBT chip, turns off the base emitter voltage to the IGBT before turning off the auxiliary MOSFET during turn off. The auxiliary MOSFET is turned off again at the beginning of the conduction period to ensure full conductivity modulation of the DMOS drain and maximum gain of the PNP transistor. Short circuit protection and overtemperature protection circuits are also integrated into the chip.

23 Claims, 3 Drawing Sheets

HIGH SPEED IGBT

This is a continuation of application Ser. No. 08/308,655 filed on Sep. 19, 1994, now abandoned.

BACKGROUND OF THE INVENTION

This invention relates to insulated gate bipolar transistors, and more specifically relates to a novel ultrafast IGBT which incorporates an integrated auxiliary MOSFET to sweep away minority charge carriers during turn off of the IGBT.

IGBTs are well known bipolar transistors which use a MOS gate to control turn on and turn off. A typical IGBT structure is shown in copending application Ser. No. 08/041,136, filed Mar. 30, 1993, entitled POWER TRANSISTOR DEVICE HAVING ULTRA DEEP INCREASED CONCENTRATION REGION, now refiled on Sep. 30, 1994 as copending application Ser. No. 08/316,112, and is assigned to the assignee of the present invention. IGBTs have a higher current carrying capacity than a power MOSFET of comparable chip size and a lower forward voltage drop but, because they are minority carrier devices, have an inherently lower speed. In order to increase their speed, it is common to use lifetime killing techniques at the cost of increased expense and degradation of other characteristics. Further, it is difficult to integrate control functions, such as overtemperature control circuits into such devices.

BRIEF DESCRIPTION OF THE INVENTION

In accordance with the present invention, an additional FET is integrated into an IGBT such that the source-to-drain circuit of the FET is in parallel with the emitter-base circuit of the IGBT bipolar transistor. A driver circuit is integrated into the same chip and operates to turn off the base-emitter voltage to the bipolar transistor before turning off the added FET. This sweeps out minority carriers to enable subsequent higher speed turn off of the IGBT.

More specifically, the novel power device may be a composite structure which uses either or both lateral and vertical current flow. The IGBT consists of a high voltage N-channel lateral DMOS device which drives the base of a high gain vertical PNP whose collector is the substrate of the semiconductor chip. The base of the PNP section is controllably shorted to the emitter of the PNP transistor by a low voltage NMOS device which may be integral with the IGBT structure. The low voltage NMOS device is turned on at the end of the conduction cycle to turn off the PNP device prior to turning off the lateral DMOS transistor. This allows the base charge of the PNP transistor to be swept away before the main switching action occurs, which causes the turn off to resemble that of a FET device more than that of a bipolar device.

The added NMOS device remains on during the off period of the PNP device by "bootstrapping", using its own gate capacitor stored charge, thus assuring that BVces is achieved in the reverse blocking state. The NMOS device is turned off at the beginning of the conduction period to allow full conductivity modulation of the DMOS drain and maximum gain for the PNP.

The drive circuitry controlling the integrated devices may be integrated into the same chip as the power devices, which eliminates switching speed reduction caused by package lead inductances. The gate capacitance of the controlling DMOS is quite small because it is a lateral device, making the drive circuit also very small.

The features of short circuit and overtemperature protection can also be included in the integrated circuitry at little extra cost. Overtemperature circuitry of the type used in IR3010 (SMARTFET device) manufactured by the International Rectifier Corporation of El Segundo, Calif., the assignee of this invention, could be applied here. The voltage of the PNP base can be sensed during the conduction period and compared to a maximum allowable Vceon to cause shutdown under shorted load conditions. A 12 to 18 volt power supply for these circuits must be provided to the chip. An undervoltage lockout could also be included in the integrated circuit. A standard TTL compatible input can be provided. The center lead of a TO220 package could be used as a source kelvin contact lead, if desired, to reference the input signal, while the tab provides the power source connection.

The power device will not interfere with the control functions on the chip, due to the absence of back junction injecting substrate minority carriers. Electron injection to the P$^-$ wells containing control devices will be low level, and largely confined to the area under and immediately adjacent to the power device junctions. Caution should be exercised in keeping any N$^-$ epi regions, which cannot tolerate even low levels (microamps) of parasitic leakage to the substrate, spaced sufficiently away from the power device.

Other features and advantages of the present invention will become apparent from the following description of the invention which refers to the accompanying drawings.

BRIEF DESCRIPTION OF THE INVENTION

DETAILED DESCRIPTION OF THE DRAWINGS

Figure 1:
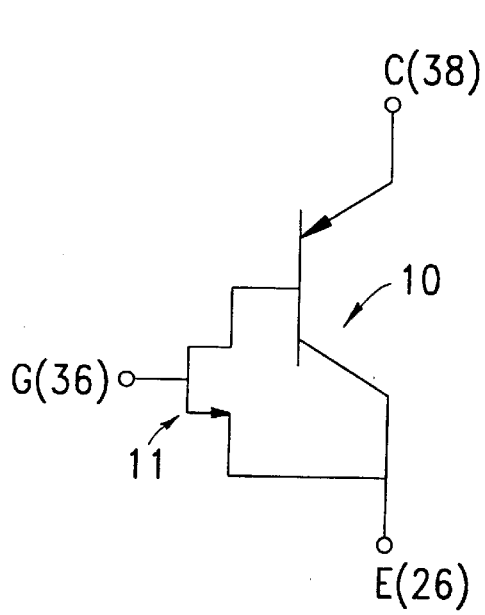
FIG. 1 shows the equivalent circuit diagram of a prior art IGBT.
Figure 2:
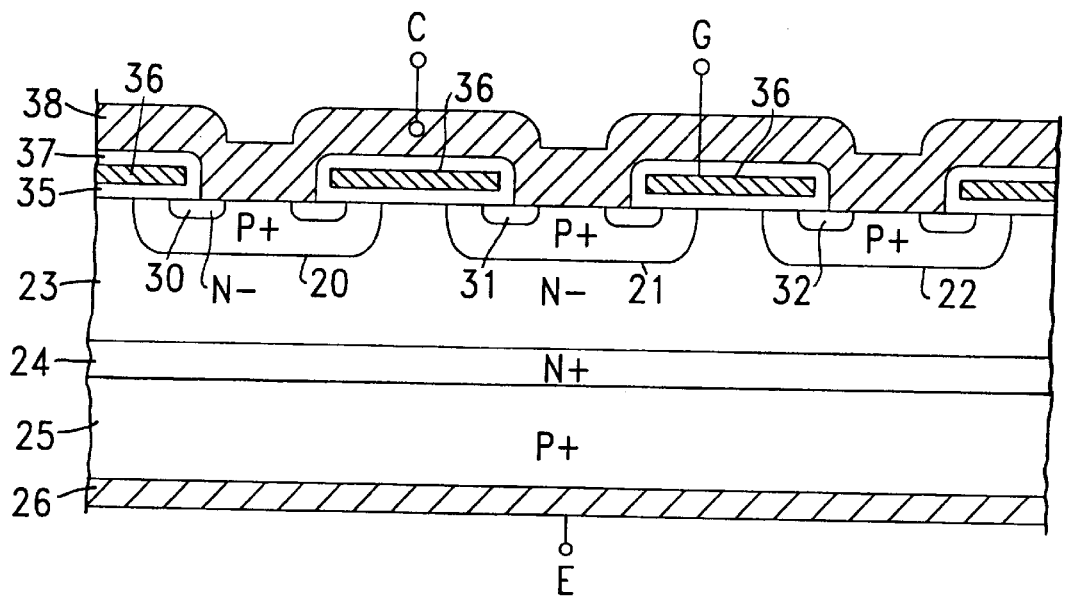
FIG. 2 is a cross-section of the junction pattern of a prior art IGBT structure.

FIGS. 1 and 2 show a prior art IGBT, which is basically a PNP bipolar transistor 10, which has a lateral N channel MOSFET 11 to control the base of the bipolar transistor 10. FIG. 2 shows a tiny portion of the junction pattern of the IGBT transistor 10 which may have a large number of symmetrically disposed parallel P type diffusions, such as diffusions 20, 21 and 22, which are diffused into the top surface of junction-receiving epitaxially formed N$^-$ body 23. Body 23 is formed atop the thin N$^+$ buffer layer 24 which is atop the main P$^+$ chip substrate 25. An emitter electrode 26 is deposited on the bottom of substrate 25.

Each of P diffusions 20, 21 and 22 has a respective annular source region 30, 31 and 32 to form annular channel regions within their respective P diffusion. These channel regions are covered by a common gate oxide lattice 35 which is, in turn, covered by a conductive polysilicon lattice 36. An interlayer oxide 37 then covers the upper surface of the chip and insulates the polysilicon gate. A collector electrode 38 covers the entire upper surface of the device and electrically contacts the center of each P type diffusion on base 20, 21 and 22 and their respective source regions 30, 31 and 32. P type diffusions 20, 21 and 22 and their sources, and the channels defined thereby, define, with the surrounding vertical common conduction region defined by adjacent diffusions, a plurality of identical cells. However, the prior art device may also be made with an interdigitated or other topology.

In operation, when a positive voltage is applied to gate electrode 36, the P type channel region of each cell inverts to connect the $N^+$ sources to the $N^-$ body, which is the base of the PNP transistors that have P diffusions (emitters) 20, 23, 25. The $P^+$ regions begin to inject holes into the $N^-$ region 23 to turn on the PNP transistor over the full surface area of each cell.

To turn off the device of FIGS. 1 and 2, the gate signal to gate 36 is removed, thus removing the base drive from region 23. The injected holes in region 23 are then swept up in the usual manner and the transistor gradually turns off. The need to collect minority carriers in the $N^-$ region 23 substantially decreases the speed of the device, as compared to the speed of an equivalent power MOSFET which does not have the $P^+$ region 25. The device speed can be increased by killing lifetime in the $N^-$ region 23 but this is at the expense of higher forward voltage drop.

Structures such as those described for FIGS. 1 and 2 are described in more detail in copending application Ser. No. 08/316,112, the disclosure of which is incorporated herein by reference.

Figure 3:
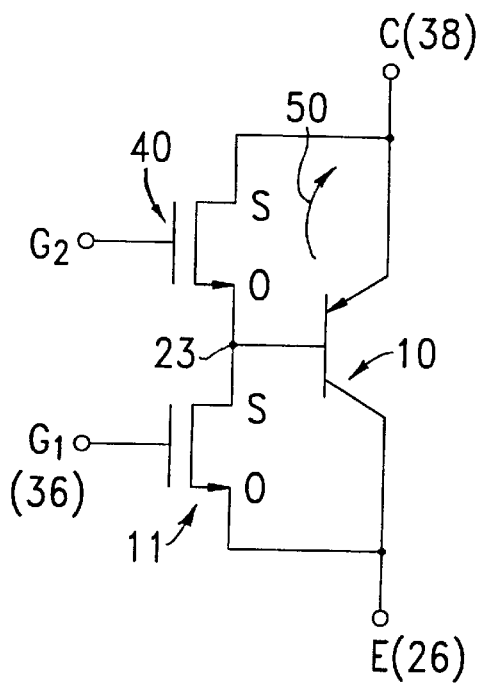
FIG. 3 is an equivalent circuit diagram of the IGBT of the present invention.

In accordance with the present invention, and as schematically shown in FIG. 3, an additional MOSFET 40 is added to the device of FIG. 1 to assist in more rapid turn off of the IGBT. MOSFET 40 is an N channel device having its source connected to the source regions 30, 31, 32 of cells containing diffusions 20, 21 and 22, respectively. Its drain is connected to epitaxial region 23, which is the PNP transistor base region which is flooded with minority carriers when the PNP transistor 10 is on.

In operation, the novel added transistor 40 is turned off prior to turn on of MOSFET 11 of the main IGBT 10. This turns off "Vbe" of transistor 10. To turn off the transistor 10, MOSFET 40 is turned on, thus providing a closed path 50 shown in FIG. 3 to divert electron current flow which reduces production of minority carriers (holes) in region 23, and to sweep minority carriers from region 23 into the collector (source) regions 35, 36 and 37. MOSFET 11 then turns off at a higher speed than prior art IGBTs because a large percentage of the minority carriers have been swept out of region 23, around path 50.

Figure 4:
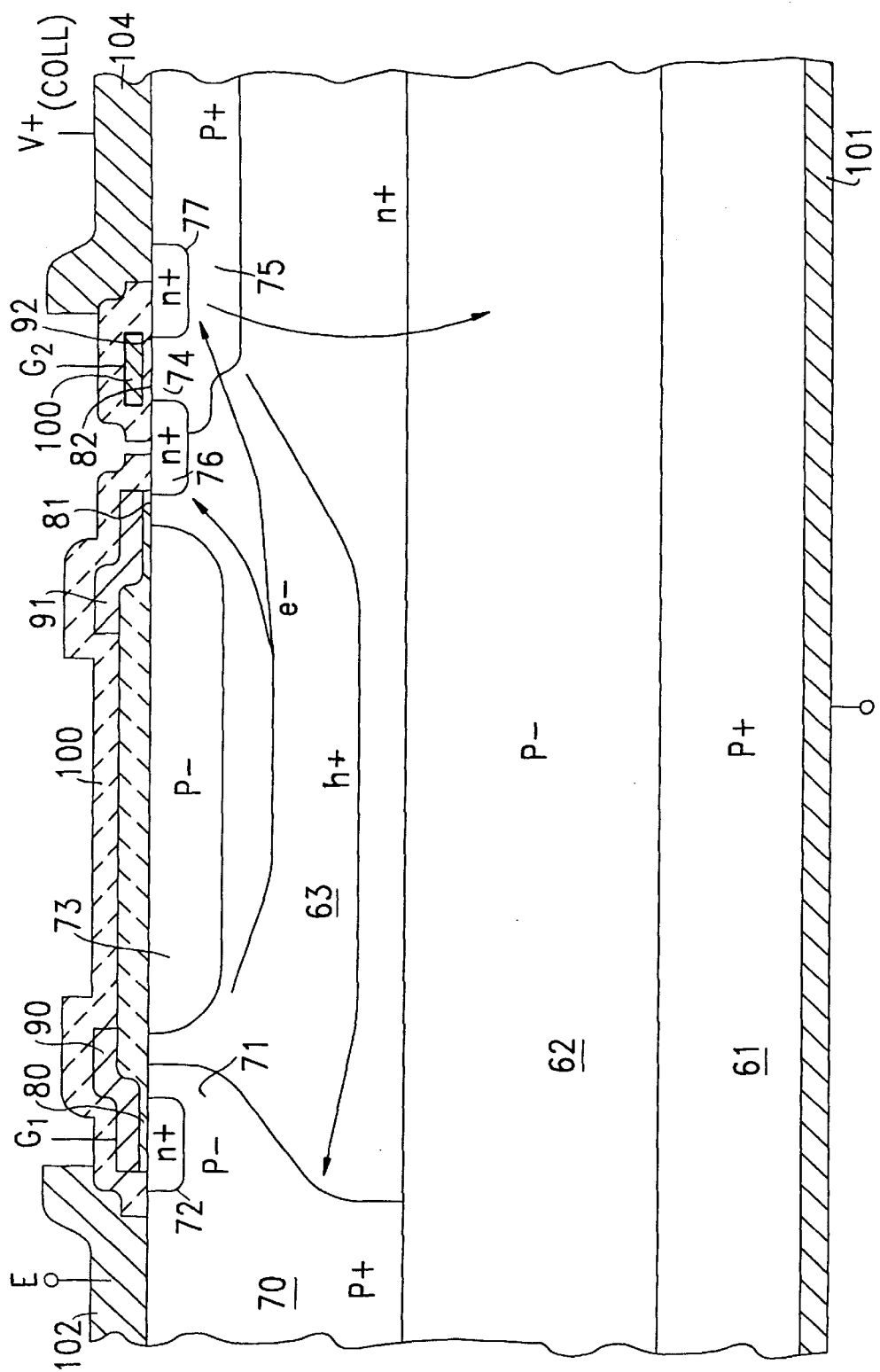
FIG. 4 is a cross-section of one possible junction pattern for the IGBT structure of the present invention.

FIG. 4 shows the manner in which the circuit of FIG. 3 can be implemented in silicon, in a combined lateral and vertical conduction device. More specifically, the device structure consists of a silicon chip 60, a small element of which is shown in cross section in FIG. 4. The chip has a $P^+$ body 61 and an epitaxially grown $P^-$ region 62 thereon. For a 600 volt device, the $P^-$ region is about 40 microns thick. An $N^-$ epitaxial region 63 is grown atop region 62 to a thickness of about 20 microns.

The main IGBT of the device is formed by parallel interdigitated strips, but can have any other desired geometry such as a serpentine geometry.

Thus, a $P^+$ diffusion 70, which is an elongated strip into the paper, extends into and through $N^-$ region 63 and to the $P^-$ body 62. A shallow, $P^-$ concentration diffusion 71 blends into diffusion 70 and extends from the chip upper surface. An $N^+$ drain strip 72 is formed in the combined body 70-71 as shown.

A $P^-$ diffusion 73 and a shallow $P^-$ diffusion region 74 are also formed with region 71. These diffusions may have a concentration corresponding to $1 \times 10^{-12}$ ohms per $cm^2$. $P^+$ diffusion 75 is preferably formed before $P^-$ regions 71, 73 and 74. $N^+$ strips 76 and 77, which are the drain and source regions of the auxiliary MOSFET 40 of FIG. 3, are formed during the formation of $N^+$ strip 72.

Gate oxide layers 80 and 81 are formed over the $P^-$ channel region 71 and over the N- region between $P^-$ strip 73 and $N^+$ region 76. A further gate oxide layer 82 is disposed over the $P^-$ region between $N^+$ strips 76 and 77.

Polysilicon electrodes 90 and 91, which are connected together to define gate $G_1$ of the IGBT of FIG. 3 are formed over gate oxide layers 80 and 81. Polysilicon electrode 92 overlies oxide 82 and is gate $G_2$ for the auxiliary MOSFET 40. An interlayer oxide 100 overlies the polysilicon gate electrodes 90, 91 and 92.

The emitter electrode 101 for the device, which can also be termed the power ground, is formed on the bottom of chip 60. A second emitter or power ground 102 for the IGBT contacts the $P^+$ region and $N^+$ strip 72 on top of the chip. The collector electrode 104 or "$V^+$" electrode contacts $P^+$ region 75 and $N^+$ region 77.

The device as disclosed in FIG. 4 is an IGBT which has both vertical and lateral conduction paths but has the control MOSFET 40 integrated therein. Thus, to turn on the IGBT, polysilicon gates 90–91 invert the regions under gate oxide layers 80 and 81, turning on the lateral IGBT 11 (FIG. 3) consisting of P region 70-71, $N^-$ region 63 and $P^+$ region 75 to permit turn on and conduction between electrodes 102 and 104. That is, $P^+$ region 75 will inject holes $h^+$ laterally through region 63 and an electron current $e^-$ will flow in the opposite lateral direction. At the same time, holes $h^+$ will be injected from $P^+$ region 75 vertically downward to electrode 101 and an electron current $e^-$ will flow in the reverse direction.

The presence of the $P^+$ region 75 will force early avalanche breakdown under $P^+$ region 75 and away from the emitter terminal 102, thus reducing the chance of sufficient avalanche current flow under $N^+$ strip 72 to turn on the parasitic NPN transistor formed of N+ strip 72, P- region 71, and epitaxial region 63.

In order to speed up the operation of the IGBT, the auxiliary MOSFET 40, consisting of regions 76, 77 and 74, is turned on just before turn off of the IGBT to reduce hole injection before turn off. Thus, while the IGBT is conducting, $G_1$ is high and $G_2$ is low. Just before turn off, $G_2$ is made high. This stops hole injection from region 75 just before turn off to reduce the population of holes in region 62. Gate $G_1$ is then turned low or off and the IGBT turns off at relatively high speed (compared to a conventional IGBT) in view of the smaller number of minority carriers in region 63.

It should be noted that the $P^+$ region 75 serves a number of functions. First, it permits the flow of vertical current, thus reducing forward voltage drop. Second, it limits the volume needed for $P^-$ region 62 and the number of holes which must be swept out to speed up the device. $P^+$ region 75 also forces avalanche under the collector and away from the emitter terminal 102, thus reducing the chance of activating the NPN parasitic transistor.

Figure 5:
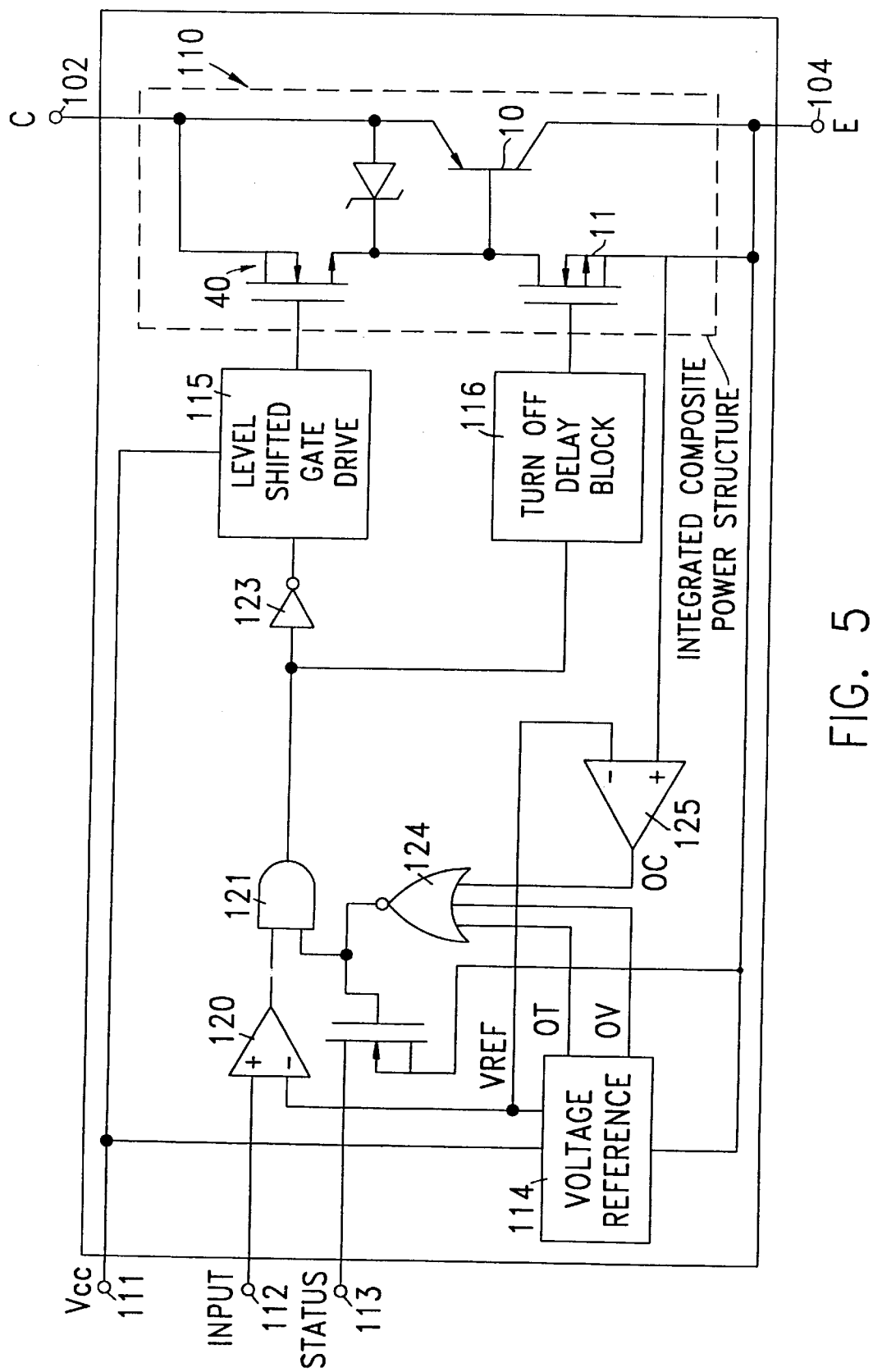
FIG. 5 is a schematic diagram of an integrated circuit chip which integrates control functions with the IGBT of FIGS. 3 and 4.

FIG. 5 is a block diagram of the novel device of the invention, with control circuits integrated into the same silicon. Thus, the main device, as described in FIGS. 3 and 4, is the composite power structure 110 having collector and emitter electrode pins 38 and 26, respectively. The composite contains PNP transistor 10 and MOSFETs 11 and 40 of FIG. 3. $V_{cc}$, input and status pins 111, 112 and 113 are also added, where the device is mounted in a 5 pin, T0220 type package. The other control circuit components are a voltage reference circuit 114, a level shift gate drive circuit 115 for MOSFET 40, and a turn-off delay circuit 116 to MOSFET 11, which allows MOSFET 40 to turn on before MOSFET 11 turns off. Other control circuits 120 through 125 are provided which control and monitor chip overtemperature ("OT") and turn off the device 110 if the chip temperature exceeds a given value, and to monitor chip overcurrent ("OC") to turn off the chip if the collector current exceeds a given value. Note that the power device 110 will not interfere with the control functions since there is no back junction which can inject minority carriers into the control structure.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high speed IGBT device comprising, in combination, an IGBT device consisting of a PNP bipolar transistor having collector, emitter and base regions and a first N-channel MOSFET having source and drain regions and a respective gate electrode; said source region of said first MOSFET being connected to said base region of said PNP transistor; said drain region of said first MOSFET and said emitter region of said PNP transistor being connected to one another and to an emitter electrode; and a second N-channel MOSFET having respective source and drain regions and a respective gate electrode; said source region of said second MOSFET and said collector region of said PNP bipolar transistor being connected to one another and to a collector electrode; said drain region of said second MOSFET being connected to said source region of said first MOSFET; said respective gate electrodes of said first and second MOSFETs being capable of turning on and off one of said first and second MOSFETs regardless of whether another one of said first and second MOSFETs is on or off; said first and second MOSFETs and said PNP transistor being integrated into a common silicon chip; said first and second MOSFETs and said PNP transistor being arranged in said common silicon chip such that when said second MOSFET is turned on first before said first MOSFET is turned off, the number of minority carriers in said PNP transistor is reduced thereby increasing the turn-off speed of said PNP transistor and said IGBT and being further arranged to limit the number of minority carriers that are initially present in said PNP transistor prior to said second MOSFET being turned on and said first MOSFET being turned off.

2. The device of claim 1, wherein the application and removal of a gate voltage to said gate electrode of said first MOSFET turns said PNP transistor on and off respectively.

3. The device of claim 2 which further includes control circuit means for turning on said IGBT by applying a voltage to said gate of said first MOSFET and for turning off said IGBT by first turning on said second MOSFET and then turning off said first MOSFET.

4. A high speed IGBT device comprising, in combination, an IGBT device consisting of a PNP bipolar transistor having collector, emitter and base regions and a first N-channel MOSFET having source and drain regions and a respective gate electrode; said source region of said first MOSFET being connected to said base region of said PNP transistor; said drain region of said first MOSFET and said emitter region of said PNP transistor being connected to one another and to an emitter electrode; and a second N-channel MOSFET having respective source and drain regions and a respective gate electrode; said source region of said second MOSFET and said collector region of said PNP bipolar transistor being connected to one another and to a collector electrode; said drain region of said second MOSFET being connected to said source region of said first MOSFET; said respective gate electrodes of said first and second MOSFETs being capable of turning on and off one of said first and second MOSFETs regardless of whether another one of said first and second MOSFETs is on or off; said first and second MOSFETs and said PNP transistor being integrated into a common silicon chip; said collector electrode being disposed on the top surface of said chip; said emitter electrode having a first portion thereof on said top surface of said chip to define a lateral conduction IGBT and having a second portion thereof on the bottom surface of said chip to define a vertical conduction IGBT.

5. The device of claim 4, wherein the application and removal of a gate voltage to said gate electrode of said first MOSFET turns said PNP transistor on and off respectively.

6. The device of claim 5, wherein said second MOSFET is turned on first before said first MOSFET is turned off, the number of minority carriers in said PNP transistor is reduced and the turn off speed of said PNP transistor, and of said IGBT is increased.

7. The device of claim 5 which further includes control circuit means for turning on said IGBT by applying a voltage to said gate of said first MOSFET and for turning off said IGBT by first turning on said second MOSFET and then turning off said first MOSFET.

8. The device of claim 4, wherein said emitter and collector regions of said PNP transistor are laterally removed from one another at the top surface of said chip.

9. The device of claim 8, wherein said emitter region for said PNP transistor is formed at the bottom of said chip.

10. The device of claim 9, wherein said collector region has a deepened diffusion region to define a preferred path of avalanche breakdown which is removed from said emitter region at the top of said chip.

11. The device of claim 8, wherein said second MOSFET source region is diffused into said collector region of said PNP transistor.

12. The device of claim 10, wherein said second MOSFET source region is diffused into said collector region of said PNP transistor.

13. The device of claim 8, wherein said source of said first MOSFET is diffused into said emitter region of said PNP transistor at the top of said chip.

14. The device of claim 11, wherein said source of said first MOSFET is diffused into said emitter region of said PNP transistor at the top of said chip.

15. A high speed IGBT device comprising a silicon chip having top and bottom surfaces; said chip having a P+ lower body, a P– region formed over the upper surface of said P+ lower body, an N– region formed over the upper surface of said P– region, a P type emitter region diffused into said N– region, a P– buffer diffusion laterally spaced from said P type emitter region, a P type collector region laterally spaced from said P– buffer diffusion, an N+ drain region forming the drain of a first MOSFET diffused into said P type emitter region, a first MOS gate structure disposed atop said P type emitter region and being operable to connect said N+ drain of said first MOSFET to said N– region, an N+ source and N+ drain for a second and lateral MOSFET diffused into said P type collector region and a second MOS gate structure for turning said second MOSFET on and off, an emitter electrode disposed atop said top surface of said chip and being connected to said P type emitter region and to said drain region of said first MOSFET, and a collector electrode connected to said P type collector region and to said source region of said second MOSFET; said first and second MOS gate structures being capable of turning on and off one of said first and second MOSFETs regardless of whether another one of said first and second MOSFETs is on or off.

16. The device of claim 15, which further includes a second emitter electrode connected to the bottom of said chip.

17. The device of claim 15, wherein said collector region has a deepened $P^+$ region which defines a path of preferred avalanche breakdown, which is removed from the area of said first MOSFET.

18. The device of claim 15, wherein the application and removal of a gate voltage to said gate electrode of said first MOSFET turns said PNP transistor on and off respectively.

19. The device of claim 16, wherein the application and removal of a gate voltage to said gate electrode of said first MOSFET turns said PNP transistor on and off respectively.

20. The device of claim 18, wherein said second MOSFET is turned on first before said first MOSFET is turned off, the number of minority carriers in said PNP transistor is reduced and the turn off speed of said PNP transistor and of said IGBT is increased.

21. The device of claim 19, wherein said second MOSFET is turned on first before said first MOSFET is turned off, the number of minority carriers in said PNP transistor is reduced and the turn off speed of said PNP transistor and of said IGBT is increased.

22. The device of claim 15 which further includes control circuit means for turning on said IGBT by applying a voltage to said gate of said first MOSFET and for turning off said IGBT by first turning on said second MOSFET and then turning off said first MOSFET.

23. The device of claim 16 which further includes control circuit means for turning on said IGBT by applying a voltage to said gate of said first MOSFET and for turning off said IGBT by first turning on said second MOSFET and then turning off said first MOSFET.

* * * * *